US012725646B2

(12) United States Patent
Athena et al.

(10) Patent No.: US 12,725,646 B2
(45) Date of Patent: Sep. 1, 2026

(54) FERROELECTRIC IN-MEMORY COMPUTING

(71) Applicant: INTERNATIONAL BUSINESS MACHINES CORPORATION, Armonk, NY (US)

(72) Inventors: Fabia Farlin Athena, Atlanta, GA (US); Takashi Ando, Eastchester, NY (US); Paul Michael Solomon, Westchester, NY (US); Nanbo Gong, White Plains, NY (US); Guy M. Cohen, Westchester, NY (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 18/731,184

(22) Filed: May 31, 2024

(65) Prior Publication Data

US 2025/0372142 A1 Dec. 4, 2025

(51) Int. Cl.
*G11C 11/54* (2006.01)
*G11C 11/22* (2006.01)

(52) U.S. Cl.
CPC ...... *G11C 11/2273* (2013.01); *G11C 11/2275* (2013.01); *G11C 11/54* (2013.01)

(58) Field of Classification Search
CPC ............................ G11C 11/2273; G11C 11/54
USPC ........................................................ 365/145
See application file for complete search history.

(56) References Cited

U.S. PATENT DOCUMENTS

| | | | | |
|---|---|---|---|---|
| 9,922,956 | B2 | 3/2018 | Lan | |
| 11,139,401 | B2 | 10/2021 | Doyle | |
| 11,616,057 | B2 | 3/2023 | Majhi | |
| 11,886,987 | B2 * | 1/2024 | Das | G06N 3/045 |
| 2021/0111179 | A1 | 4/2021 | Shriram | |
| 2022/0180156 | A1 * | 6/2022 | Gong | G06N 3/063 |

(Continued)

FOREIGN PATENT DOCUMENTS

EP 3291290 A1 3/2018

OTHER PUBLICATIONS

Cheng, Y. et al., "Emerging Monolithic 3D Integration: Opportunities and Challenges from the Computer System Perspective", Research Gate (2022), 16 pgs.

(Continued)

*Primary Examiner* — Anthan Tran
(74) *Attorney, Agent, or Firm* — Harrity & Harrity, LLP

(57) ABSTRACT

A computer program product for training a machine learning model. A processor executes program instructions stored on a computer readable media to perform a forward pass read by applying a bias input voltage to a gate of a first resistive processing unit (RPU) configured for infrequent writes and storing a first conductance value representing a synaptic weight value to read from the first RPU a product of the bias input voltage and the first conductance value. The processor performs a backward pass to compute a loss value for the forward pass read and to compute a gradient value to minimize the loss value. The processor applies a coercive input voltage to a gate of a second RPU configured differently for frequent writes to write to the second RPU a second conductance value related to the gradient value and representing a gradient accumulation value.

7 Claims, 13 Drawing Sheets

(56) References Cited

U.S. PATENT DOCUMENTS

2022/0328502 A1 10/2022 Yu
2022/0391681 A1* 12/2022 Gokmen .............. G11C 13/004

OTHER PUBLICATIONS

Choe, G. et al., "3D AND-Type Ferroelectric Transistors for Compute-in-Memory and the Variability Analysis", IEEE Electron Device Letters (2022), vol. 43:2, pp. 304-307.
Dutta, S. et al., "Monolithic 3D Integration of High Endurance Multi-Bit Ferroelectric FET for Accelerating Compute-In-Memory", IEEE (2023), 4 pgs.
Dutta, S. et al., "Lifelong Learning with Monolithic 3D Ferroelectric Ternary Content-Addressable Memory", IEEE (2023), 4 pgs.
Gokmen, T. "Enabling Training of Neural Networks on Noisy Hardware", Frontiers in Artificial Intelligence (2021), 14 pgs.
Gong, N. et al., "Why is Fe—HfO2 more suitable than PZT or SBT for Scaled Nonvolatile 1-T Memory Cell?—A Retention Perspective", IEEE Electronic Devices Letters (2016), 4 pgs.
Hsueh, F. et al., "First Demonstration of Ultrafast Laser Annealed Monolithic 3D Gate-All-Around CMOS Logic and FeFET Memory with Near-Memory-Computing Macro", IEEE (2023), 4 pgs.
Lue, H. et al., "3D AND: a 3D Stackable Flash Memory Architecture to Realize High-Density and Fast-Read 3D NOR Flash and Storage-Class Memory", IEEE (2023), 4 pgs.
Lue, H. et al., "Introduction of 3D AND-type Flash Memory and It's Applications to Computing-in-Memory (CIM)", IEEE (2023), 2 pgs.
Luo, Y. et al., "Monolithic 3D Compute-in-Memory Accelerator with BEOL Transistor based Reconfigurable Interconnect", IEEE (2021), 4 pgs.
Ni, K. et al., "Critical Role of Interlayer in Hf0.5Zr0.5O2 Ferroelectric FET Nonvolatile Memory Performance", IEEE Transactions on Electron Devices (2018), vol. 65:6, pp. 2461-2469.
Prakash, O. et al., Monolithic 3D Integrated BEOL Dual-Port Ferroelectric FET to Break the Tradeoff Between the Memory Window and the Ferroelectric Thickness, IEEE (2023), 4 pgs.
Wang, P. et al., "Drain-Erase Scheme in Ferroelectric Field Effect Transistor—Part I: Device Characterization", IEEE Transactions On Electron Devices (2020), 7 pgs.
Ye, H. "High-Performance Back-End-Of-Line Compatible Indium Tungsten Oxide (Iwo) Transistors For Monolithic-3d Application", A Dissertation, submitted to the University of Notre Dame (2022), 24 pgs.
Yin, X. et al., "FeCAM: A Universal Compact Digital and Analog Content Addressable Memory Using Ferroelectric", IEEE Transactions On Electron Devices (2020), vol. 67:7, pp. 2785-2792.

* cited by examiner

FERROELECTRIC IN-MEMORY COMPUTING

BACKGROUND

Technical Field

The present disclosure generally relates to analog resistive memory systems, and more particularly, to in-memory computing with non-volatile resistive processing units each having two or more ferroelectric field effect transistors.

Description of the Related Art

Information processing systems such as neuromorphic computing systems and artificial neural network systems are utilized in various applications such as machine learning and inference processing for cognitive recognition and computing. Such systems are hardware-based systems that generally include a large number of highly interconnected processing elements (referred to as "artificial nodes") which operate in parallel to perform various types of computations. The artificial nodes (such as pre-synaptic nodes and post-synaptic nodes) are connected using artificial synaptic devices, which provide synaptic weights representing connection strengths between the artificial nodes. The synaptic weights can be implemented using an array of resistive processing units (RPUs) having tunable resistive memory devices (such as tunable conductance). The conductance states of the RPUs can be encoded to represent the synaptic weights.

SUMMARY

According to an embodiment, a resistive processing unit (RPU) system is configured to perform in-memory computing operations for training a machine learning model. The RPU system includes a crossbar array of row control lines intersecting column control lines. A plurality of non-volatile resistive memory elements are each connected to one of the row control lines and to one of the column control lines. Each non-volatile resistive memory element includes a first ferroelectric field-effect-transistor (FeFET) configured to store a first conductance value that represents a synaptic weight value for the machine learning model. Each non-volatile resistive memory element also includes a second FeFET configured to store a second conductance value that represents a gradient accumulation value for the machine learning model.

In one embodiment, a computer program product is provided for performing in-memory computing operations to train a machine learning model. The computer program product includes one or more computer readable storage media and program instructions stored on the computer readable storage media. An execution of the program instructions by a processor causes the processor to perform a forward pass read on the machine learning model by applying a bias input voltage to a gate of a first resistive processing unit (RPU) configured for infrequent writes and storing a first conductance value representing a synaptic weight value to read from the first RPU a product of the bias input voltage and the first conductance value. The processor performs a backward pass on the machine learning model to compute a loss value for the forward pass read and to compute a gradient value to minimize the loss value. The processor applies a coercive input voltage to a gate of a second RPU configured differently for frequent writes to write to the second RPU a second conductance value related to the gradient value and representing a gradient accumulation value.

In an embodiment, the processor furthermore compares the gradient accumulation value to a predetermined threshold value. Upon determining that the gradient accumulation value is less than the predetermined threshold value, the processor performs a subsequent forward pass read on the machine learning model by applying the bias input voltage to the gate of the first RPU to read from the first RPU the product of the bias input voltage and the first conductance value representing the synaptic weight value. However, upon determining that the gradient accumulation value is greater than the predetermined threshold value, the processor computes an updated synaptic weight value related to the gradient accumulation value. The processor furthermore applies a third coercive input voltage to the gate of the first RPU to write to the first RPU a second conductance value representing the updated synaptic weight value. The process performs a subsequent forward pass read on the machine learning model by applying the bias input voltage to the gate of the first RPU to read from the first RPU a product of the bias input voltage and the third conductance value representing the updated synaptic weight value.

According to one embodiment, a semiconductor circuit is provided that includes a first semiconductor substrate, a first source region, a first drain region, a first channel region between the first source and first drain regions, a first ferroelectric layer, and an interfacial layer between the first channel and the first ferroelectric layer. The semiconductor circuit further includes a second semiconductor substrate, a second source region, a second drain region; a second channel region between the second source and second drain regions, and a second ferroelectric layer, wherein there is no interfacial layer between the second channel region and the second ferroelectric layer.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Figure 1:
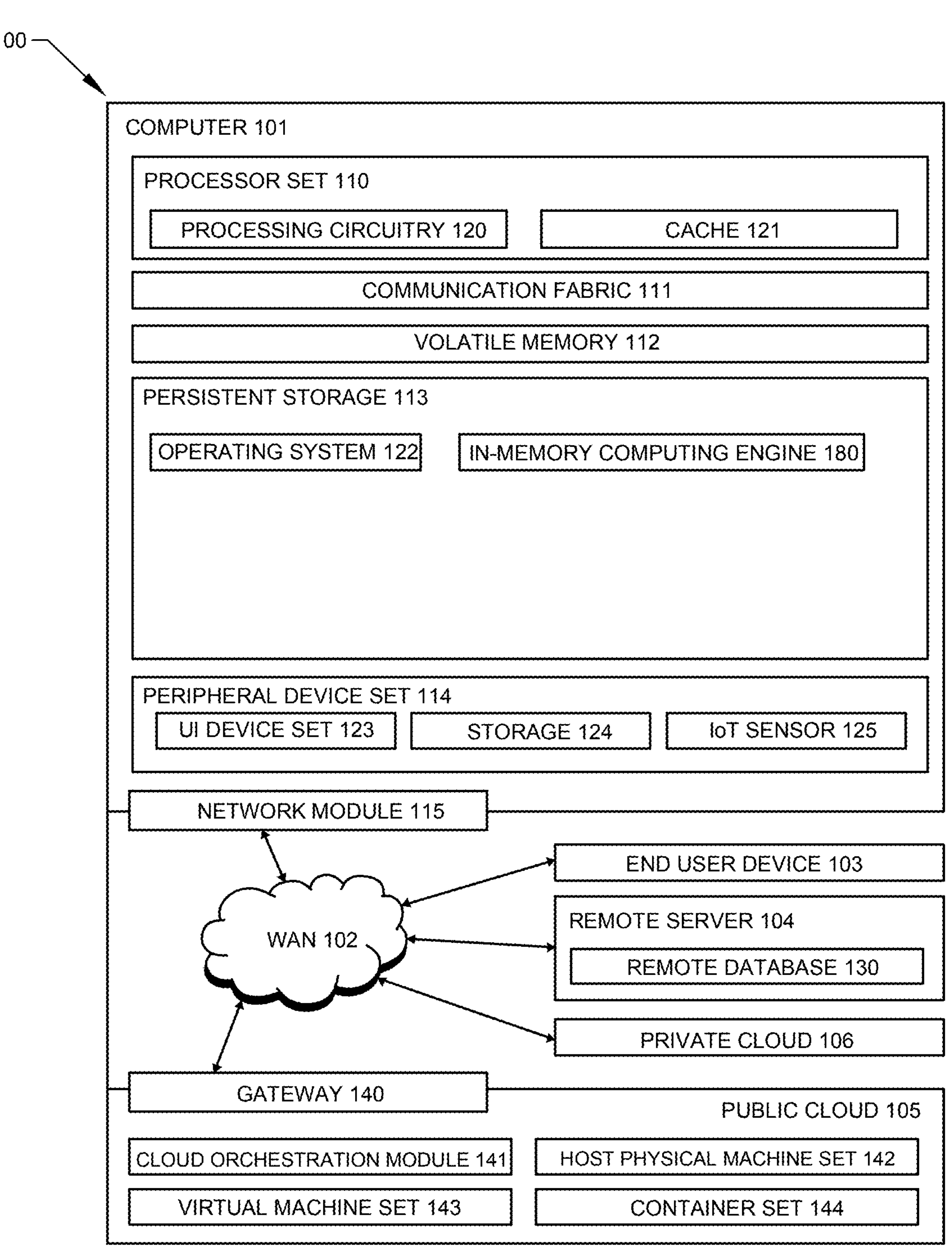
FIG. 1 is a block depiction of a computer hardware platform having an in-memory computing (IMC) engine for efficient and reliable in-memory computations, consistent with illustrative embodiments.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

Although the terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It is to be understood that other embodiments can be used, and structural or logical changes can be made without departing from the spirit and scope defined by the claims. The description of the embodiments is not limiting. In particular, elements of the embodiments described hereinafter may be combined with elements of different embodiments.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation, or garbage collection, but this does not render the storage device as transitory because the data is not transitory while it is stored.

Referring to FIG. 1, computing environment 100 includes an example of an environment for the execution of at least some of the computer code involved in performing the inventive methods discussed herein, including an in-memory computing (IMC) engine 180. In addition to the IMC engine 180, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and IMC engine 180, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in the IMC engine 180 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up buses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in the IMC engine 180 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Accordingly, the computing environment 100 generally facilitates signal processing in accordance with one or more embodiments illustratively described herein. For example, the signal processing can be related to artificial neural network systems, an artificial intelligence system, a collaborative filtering system, a recommendation system, a signal processing system, a word embedding system, a topic model system, an image processing system, a data analysis system, a media content system, a video-streaming service system, an audio-streaming service system, an e-commerce system, a social network system, an internet search system, an online advertisement system, a medical system, an industrial system, a manufacturing system, and/or another digital system. The computing environment 100 can employ hardware and/or software to solve problems that are highly technical in nature, that are not abstract and that cannot be performed as a set of mental acts by a human.

Figure 2:
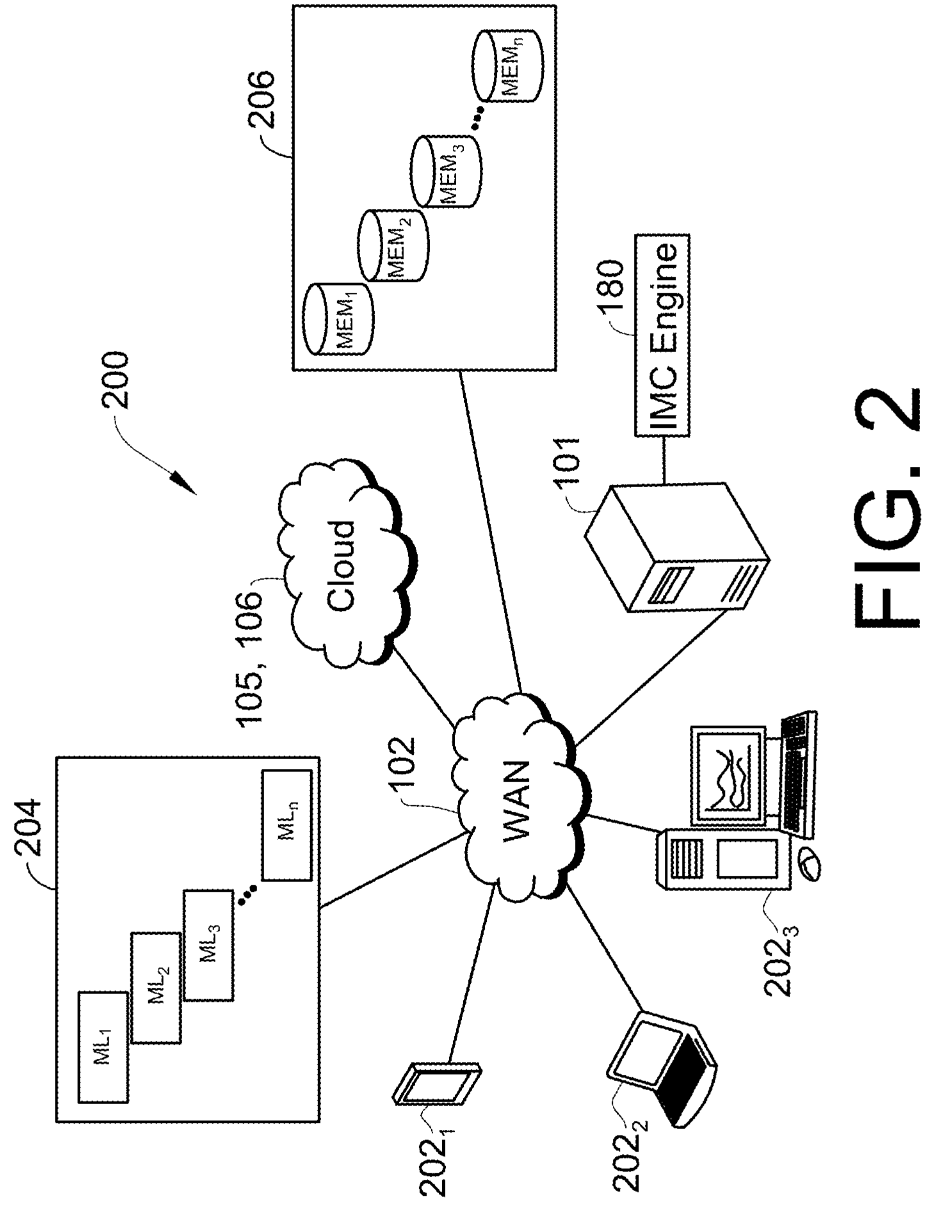
FIG. 2 conceptually illustrates an operating environment for the IMC engine of FIG. 1, consistent with illustrative embodiments.

In this disclosure of illustrative embodiments, FIG. 2 conceptually depicts the computer 101 of FIG. 1 employed as a centralized computer server in a distributed computing system 200 configured for in-memory computing operations in accordance with embodiments of this disclosure. The computer 101 can communicate via the WAN 102 with remote users and with remote computing resources.

The WAN 102 can be, but is not limited to, a local area network (LAN), a virtual private network (VPN), a cellular network, the internet, combinations thereof, and the like. For example, the WAN 102 can include a mobile network that is communicatively coupled to a private network, sometimes referred to as an intranet that provides various ancillary services, such as communication with various application stores, libraries, and the internet.

The user devices 202 can send and receive information throughout the WAN 102. They can include portable computing devices such as a portable handset 2021 or a laptop computer 2022, and they can include stationary computing devices such as a desktop computer 2023. Although not depicted, the user devices 202 can also include other computing devices such as enterprise computing systems, vehicle communications systems, smart appliances such as a smart television or projector, and wearable computing devices such as a smart watch, glasses, virtual or augmented reality computing devices, and the like. In these embodiments, distributed computing resources available to the computer 101 can include any number of computer machine learning resources 204, and computer memory resources 206 for storing data structures, programming instructions, sample data, and the like.

"Machine learning" broadly describes a function of an electronic system that learns from data. A machine learning (ML) system, engine, or module can include a trainable ML algorithm stored in computer memory that can be trained, such as in a cloud environment, to learn functional relationships between inputs and outputs that are currently unknown.

ML can be utilized to solve a variety of technical issues (e.g., learning previously unknown functional relationships) in connection with technologies such as, but not limited to, ML technologies, time-series data technologies, data analysis technologies, data classification technologies, data clustering technologies, trajectory/journey analysis technologies, medical device technologies, collaborative filtering technologies, recommendation system technologies, signal processing technologies, word embedding technologies, topic model technologies, image processing technologies, video processing technologies, audio processing technologies, and/or other digital technologies.

ML can be utilized to solve a variety of technical issues (e.g., learning previously unknown functional relationships) in connection with technologies such as, but not limited to, ML technologies, time-series data technologies, data analysis technologies, data classification technologies, data clustering technologies, trajectory/journey analysis technologies, medical device technologies, collaborative filtering technologies, recommendation system technologies, signal processing technologies, word embedding technologies, topic model technologies, image processing technologies, video processing technologies, audio processing technologies, and/or other digital technologies.

Accordingly, the computer 101 has a specialized processing unit such as the IMC engine 180 for carrying out in-memory computing operations for optimizing ML. More particularly, without limitation, the specialized processing unit automatically and consistently performs in-memory computing operations. The computer system 200 is thereby specifically configured to provide technical improvements to data systems, ML systems, artificial intelligence systems, and systems of data analysis systems such as but not limited to data classification systems, data regression systems, data batching and clustering systems, and the like. The optimization can further provide one or more inferences, provide one or more predictions, and/or determine one or more relationships among the data. For example, optimization as described herein can model one or more inferences and/or predictions and/or may determine one or more relationships amongst the variables analyzed in the data. ML predicts outputs, e.g., probabilities, from historical data. Such optimized ML helps with downstream decision making, even with such downstream decision making that is automated.

The remote ML resources 204 can employ any suitable ML based techniques, statistical-based techniques and/or probabilistic-based techniques. For example, the ML resources 204 can employ expert systems, fuzzy logic, SVMs, Hidden Markov Models (HMMs), greedy search algorithms, rule-based systems, Bayesian models (e.g., Bayesian networks), neural networks, other non-linear training techniques, data fusion, utility-based analytical systems, and the like. For example, the ML resources 204 can perform a set of clustering ML computations, a set of logistic regression ML computations, a set of decision tree ML computations, a set of random forest ML computations, a set of regression tree ML computations, a set of least square ML computations, a set of instance-based ML computations, a set of support vector regression ML computations, a set of k-means ML computations, a set of spectral clustering ML computations, Gaussian mixture model ML computations, a set of regularization ML computations, a set of rule ML computations, a set of Bayesian ML computations, a set of deep Boltzmann computations, a set of deep belief network computations, a set of convolution neural network computations, a set of stacked auto-encoder computations and/or a set of different ML computations.

Accordingly, the distributed computing system 200 generally facilitates optimizing ML in accordance with one or more embodiments illustratively described herein. For example, the optimizations can be related to high-speed parallel training trial systems, an artificial intelligence system, a collaborative filtering system, a recommendation system, a signal processing system, a word embedding system, a topic model system, an image processing system, a data analysis system, a media content system, a video-streaming service system, an audio-streaming service system, an e-commerce system, a social network system, an internet search system, an online advertisement system, a medical system, an industrial system, a manufacturing system, and/or another digital system. The system can employ hardware and/or software to solve problems that are highly technical in nature, that are not abstract and that cannot be performed as a set of mental acts by a human.

For simplicity of explanation, the specialized-computer-implemented methods are depicted and described as a series of acts. It is to be understood and appreciated that the subject innovation is not limited by the acts illustrated and/or by the order of acts. That is, for example, acts can occur in various orders and/or concurrently, and with other acts not presented and described herein. Furthermore, not all expressly disclosed acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from a computer-readable device or storage media.

The distributed computer system 200 can employ hardware and/or software to solve problems that are highly technical in nature, that are not abstract and that cannot be performed as a set of mental acts by a human. One or more embodiments of the distributed computing system 200 can also provide technical improvements to a computer processing unit associated with a ML process by improving processing performance of the computer processing unit, reducing computing bottlenecks of the computer processing unit, improving processing efficiency of the computer processing unit, and/or reducing an amount of time for the computer processing unit to perform the ML process.

Figure 3:
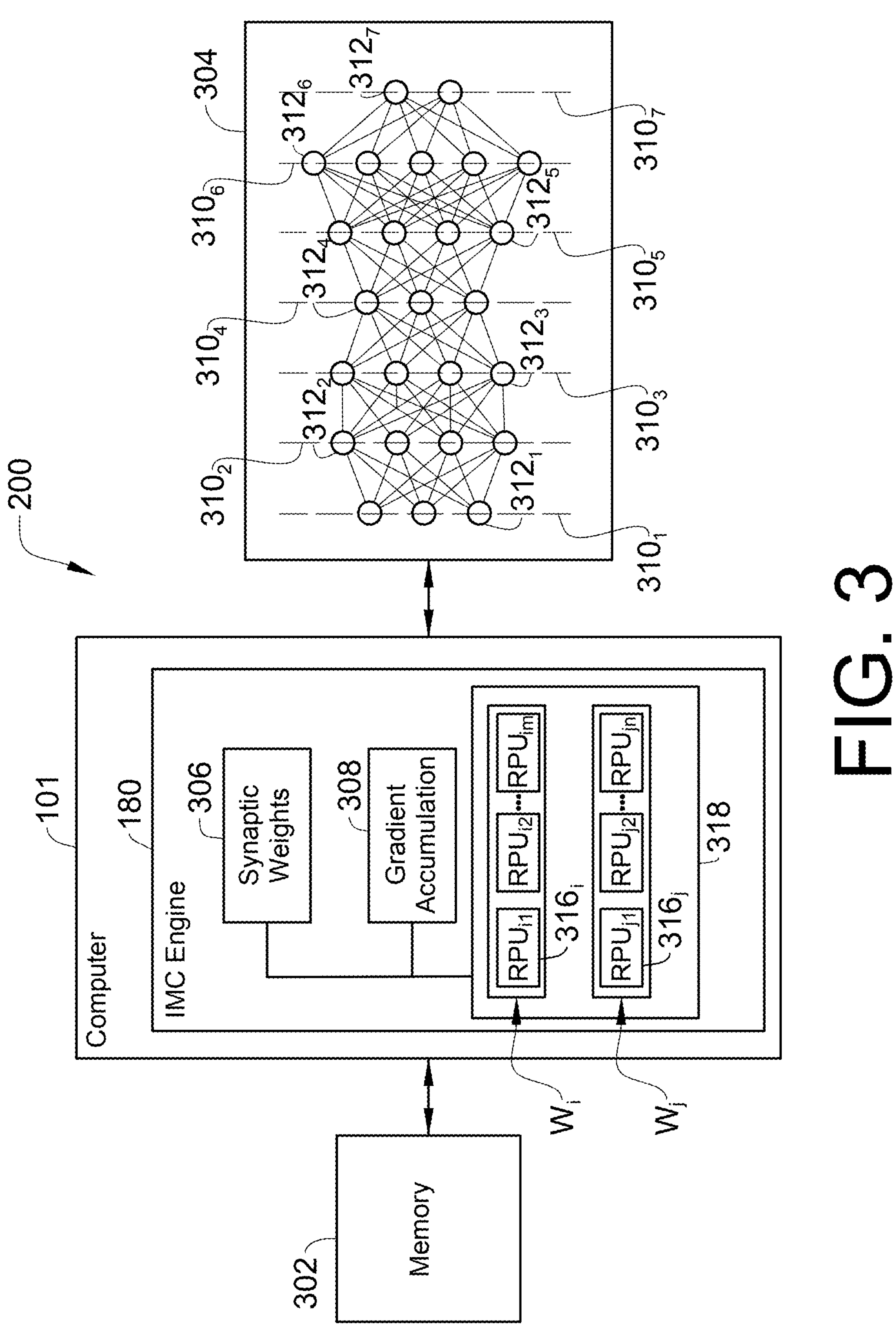
FIG. 3 schematically illustrates the operating environment for the IMC engine of FIG. 2, consistent with illustrative embodiments.

FIG. 3 schematically illustrates the distributed computing system 200, and more particularly the IMC engine 180 which can access certain computer memory 302 to train a certain ML model 304, such as but not limited to the depicted neural network. The IMC engine 180 can have one or more processor-based computation blocks, such as block

306 that can store synaptic weights and block 308 that can compute gradients during training operations on the neural network 304.

The neural network 304 is a neuromorphic computing system comprising any type of neural network including, but not limited to, a feed-forward neural network (such as a deep neural network (DNN), a convolutional neural network (CNN), and the like), a recurrent neural network (RNN) (such as a long short-term memory (LSTM) neural network), etc. The neural network 304 has a plurality of layers 310, each layer 310 containing a respective plurality of processing nodes 312. The layers 310 include an input layer 3101, an output layer 3107, and hidden layers 3102-3106. Each layer 310 is connected to another layer 310 by synaptic devices that compute synaptic weights representing connection strengths between nodes 312 in two different layers 310. The input layer 3101 receives input data for processing by the subsequent layers 3102-3107. The hidden layers 3102-3106 perform various programmed computations. The output layer 3107 inferences predictions from the programmed computations, such as classifying an input as one of multiple outputs.

The layers 310 can include fully connected layers in which each node 312 in one layer 310 is connected to each of the nodes 312 in the next layer 310. The layers 310 can include activation functions such an ReLU activation function, a sigmoid activation function, a hyperbolic tangent activation function, a softmax activation function, and the like. The layers 310 can also be of other types such a convolutional layers, pooling layers, normalization layers, and the like.

The IMC engine 180 performs digital processing operations by executing programmed computer instructions. For example, the IMC 180 can include computer processors that function based on hardware, software, firmware, etc. For example, the IMC 180 can include any number and combination of central processing units (CPUs), application-specific integrated circuits (ASICs), field programmable gate arrays (FPGAs), graphics processing units (GPUs), microprocessing units (MPUs), deep learning accelerators (DLAs), artificial intelligence (AI) accelerators, and other types of specialized processors.

In training the neural network 304, the IMC engine 180 repeatedly performs the following three processes: a forward process, a backward process, and a model parameter update process. The forward pass generates predictions and calculates errors between the predictions and ground truth. The backward pass updates the synaptic weights and backpropagates errors through the neural network 304.

So, the IMC engine 180 generally functions to use the memory 302 to compute gradients for updating the synaptic weights. The memory 302 can include non-volatile resistive memory elements, each having two or more individually allocatable resistive processing units (RPUs) 316$_i$, 316$_j$. FIG. 3 depicts an RPU allocation block 318 indexing an m number of first RPUs 316$_i$ allocated to a synaptic weight matrix $W_i$ and an n number of second RPUs 316$_j$ allocated to a gradient accumulation matrix $W_j$. Block 306 can associate the conductance values to synaptic weight values in the neural network 304. Block 308 can use the gradient accumulation $W_j$ to perform matrix-vector multiplication operations to compute gradients for updating the weight matrix $W_i$.

Figure 4:
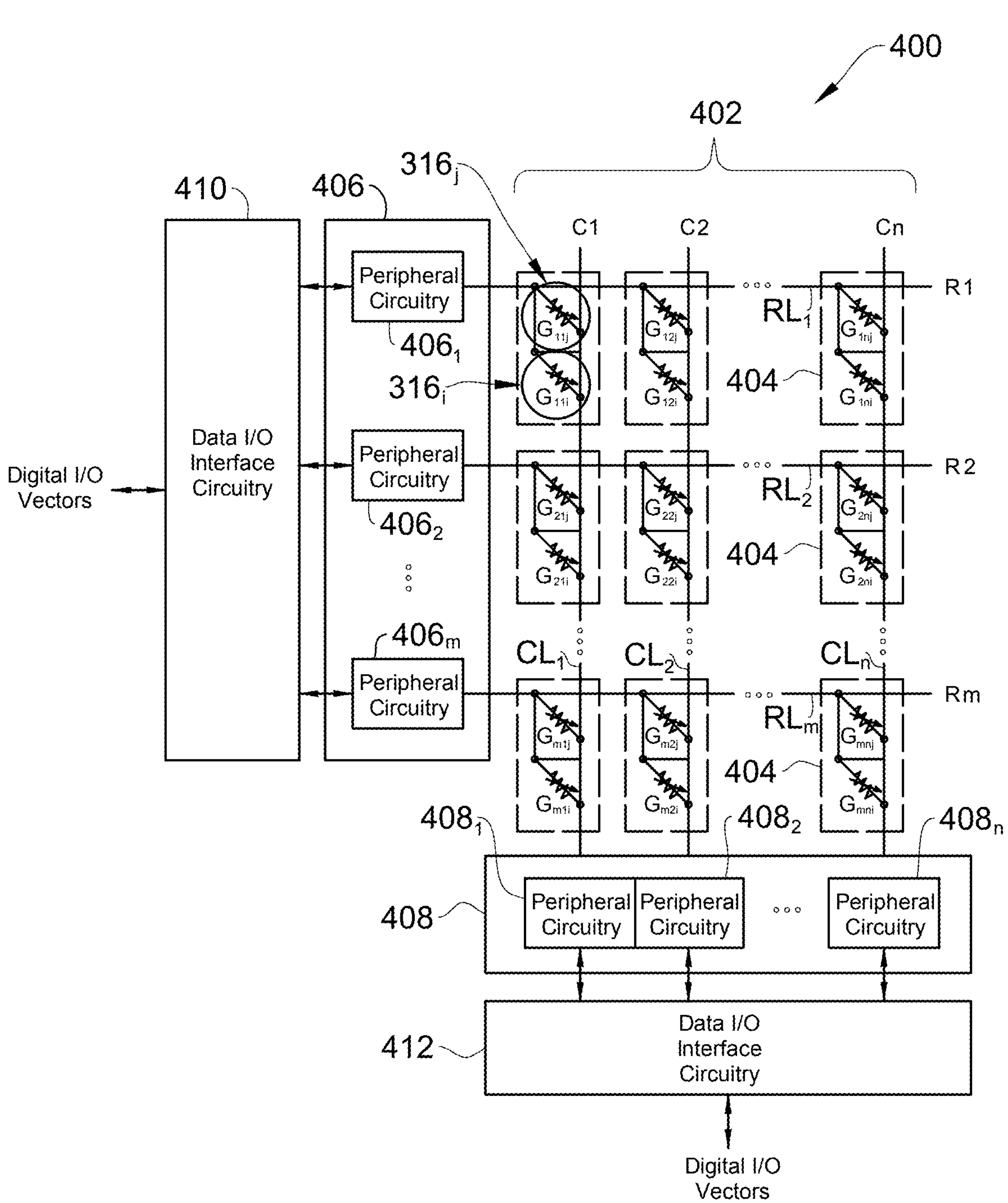
FIG. 4 schematically illustrates an array of non-volatile resistive memory elements, consistent with illustrative embodiments.

In an example, FIG. 4 depicts the memory 302 constructed of an integrated circuitry architecture forming an RPU system 400. The RPU system 400 can have an RPU array 402 of non-volatile resistive memory elements 404, consistent with illustrative embodiments. A crossbar array is formed by a plurality of rows Rm and a plurality of columns Cn. Each memory element 404 is electrically connected at an intersection of a row control line ($RL_i$) and a column control line ($CL_i$). Although FIG. 4 depicts each $RL_i$ and $CL_i$ as a single line for ease of illustration, one of skill in the art understands that each $RL_i$ and $CL_i$ can include multiple control lines connected to the memory elements 404. The memory elements 404 in each RL are connected to a peripheral circuitry block 406 by a respective $RL_i$. Similarly, the memory elements 404 in each column are connected to a peripheral circuitry block 408 by a respective $CL_i$. The peripheral circuitry blocks 406, 408 are each connected to a respective data input/output (I/O) interface circuitry block 410, 412. The row and column peripheral circuitry blocks 406, 408 and the I/O interface circuitry blocks 410, 412 can include various control signal circuitries for controlling such things as power, clock, bias, timing, and the like, to provide operable power distribution, control signals, clocking signals, and the like.

In this example, each memory element 404 includes two RPUs 316, one RPU 316$_i$ allocated to the weight matrix $W_i$ and one RPU 316$_j$ allocated to the gradient matrix $W_j$. Each RPU 316$_i$, 316$_j$ can be constructed as a non-volatile resistive device having a selectively tunable conductance. For example, the non-volatile RPUs 316 can be resistive switching devices, resistive random access memory (ReRAM), memristor devices, phase change memory (PCM) devices, and other types of resistive memory devices having a programmable conductance in order to selectively tune the conductances and the values they represent such as matrix values, synaptic weights, and the like. In these illustrative embodiments, the non-volatile RPUs 316 can be constructed as ferroelectric field-effect transistor (FeFET) devices.

Furthermore, in some embodiments, the memory elements 404 can be constructed of an analog CMOS-based circuitry in which each $RPU_i$, $RPU_j$ corresponds to a stored conductance and a read transistor. With such an analog CMOS-based framework, the conductance can serve as a memory element for storing a computational value. A voltage can be applied to a gate terminal of the read transistor to modulate a channel resistance of the read transistor based on the level of the voltage. The channel resistance of the read transistor can represent the conductance of the RPU 316 and can be correlated to a level of a read current that is generated based on the conductance.

The conductance values of some or all of the RPUs 316$_j$ cells can represent corresponding numerical values in the weight matrix $W_i$. That is, for the neural network 304 in this example, the matrix $W_i$ serves as a synaptic array for the connections of respective layers 310 in the neural network 304. The synaptic array represents connection strengths between the pre-synaptic and post-synaptic nodes 312. The peripheral circuitry blocks 406, 408 can be configured to perform functions such as writing the conductance values as encoded values in the matrix $W_i$ and reading the conductance values from the matrix $W_i$.

The RPUs 316$_j$ can be allocated for performing processing functions to support analog, in-memory computation operations such as matrix-vector multiplication operations, matrix-matrix multiplication operations, outer product update operations, and the like. For example, the peripheral circuitry blocks 406, 408 can be configured with pulse-width modulation (PWM) circuitry, as well as associated driver and readout circuitry.

The PWM circuitry and associated pulse driver circuitry can be configured to generate and apply PWM read pulses to the RLs and CLs of the RPU array 402 in response to digital input vector values that are received during different operations (such as forward pass and backward pass training operations). In some embodiments, the PWM circuitry implements digital-to-analog converter (DAC) circuitry which is configured to receive a digital input vector and convert the elements of the digital input into analog input vector values that are represented by input voltages of varying pulse width. In some embodiments, a time-encoding scheme can be used when input vectors are represented by fixed amplitude pulses with a tunable duration. The input voltages applied to RLs and CLs generate output values on the CLs and RLs which can be represented by output currents. The output currents can be processed by readout circuitry in the peripheral circuitry 406, 408.

The data I/O interface circuitry blocks 410, 412 (FIG. 4) can be configured to interface with digital processing cores that are configured to process digital I/O vectors and transmit data between the matrices $W_i$, $W_j$. The data I/O interface circuitry blocks 410, 412 can be further configured to receive external control signals and data from digital processing cores, supply the control signals and data to the peripheral circuitry blocks 406, 408, receive digital read output values from the peripheral circuitry blocks 406, 408, and send the digital read output values to a digital processing core for processing. The digital processing cores can include non-linear-function circuitry for computing activation functions and other inferential operations.

To train the neural network 304 in this example, the IMC engine 180 can be configured to perform backpropagation, which includes multiple training data iterations of (i) a forward pass operation, (ii) a backward pass operation, and (iii) a synaptic weight update operation. The forward pass operation generates predictions and calculates errors between the predictions and ground truth. The backward pass operation backpropagates errors through the neural network 304 to obtain gradients to incrementally update the synaptic weight matrix $W_i$. The forward pass and backward pass operations mainly involve performing matrix-vector multiplication computations (in forward and backward directions) in the gradient matrix $W_j$.

Figure 5A:
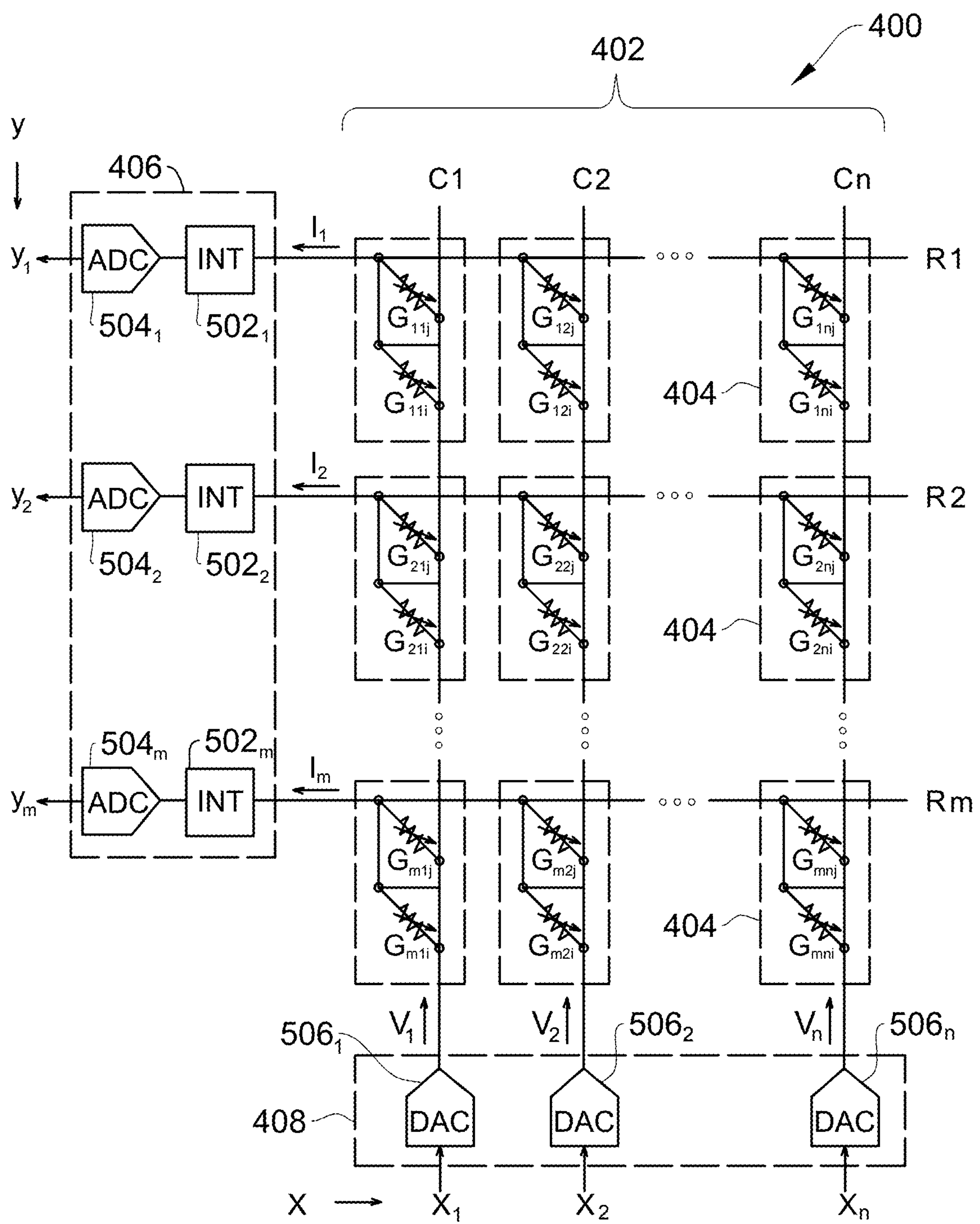
FIG. 5*a* schematically illustrates the array of non-volatile resistive memory elements in FIG. 4 during a forward training pass, consistent with illustrative embodiments.

FIG. 5*a* depicts exemplary methods for performing the forward pass computations in the gradient matrix $W_j$. The row peripheral circuitry block 406 can include readout circuitry including current integrator circuitry 502 and ADC circuitry 504. The column peripheral circuit block 408 can include DAC circuitry 506. The current integrator circuitry 502 can be configured to integrate the read current $I_i$ value for a time interval t to compute an analog output voltage. The ADC circuitry 504 can generate a digital output voltage signal value. The row peripheral circuitry block 406 and the column peripheral circuitry block 408 can also include switching circuitry configured to selectively connect the readout circuitry 502, 504 and the DAC circuitry 506 to the RLs and CLs of the RPU array 402 during the backpropagation process.

In the exemplary configuration of FIG. 5*a*, a matrix-vector multiplication process y=Wx begins by inputting a digital vector $x=[x_1, x_2, \ldots x_n]$ to the CLs of the RPU array 402. The DAC circuitry 506 generates analog voltages $V_1$, $V_2$, . . . $V_n$ at the input to the respective CLs that are proportional to the input vector values $x_1$, $x_2$, . . . $x_n$, respectively. In some embodiments, the DAC circuitry 506 can be configured with pulse-width modulation circuitry and driver circuitry to generate pulse-width modulated (PWM) read pulses $V_1$, $V_2$, . . . $V_n$ that are applied to the respective CLs. The DAC circuitry 506 can be configured to perform a digital-to-analog conversion according to a time-encoding scheme where the vector elements $x_1$, $x_2$, . . . $x_n$ are represented by fixed amplitude pulses and a tunable duration.

To perform a matrix-vector multiplication, the analog input pulses $V_1$, $V_2$, . . . $V_n$ can be applied to the CLs. Each RPU 316$_i$, 316$_j$ generates a corresponding read current $I_i$. The read currents that are generated by the RPUs 316 on each RL are summed together to generate respective currents $I_1$, $I_2$, . . . $I_m$ at the output of the respective RLs. The resulting row currents $I_1$, $I_2$, . . . $I_m$ represent the result of performing matrix-vector multiplication operations with the weight matrix $W_i$ and the input pulses $V_i$:

$$\begin{bmatrix} I_1 \\ I_2 \\ \vdots \\ I_m \end{bmatrix} = \begin{bmatrix} G_{11j} & G_{12j} & \ldots & G_{1nj} \\ G_{21j} & G_{22j} & \ldots & G_{2nj} \\ \vdots & \vdots & \ldots & \vdots \\ G_{m1j} & G_{32j} & & G_{mnj} \end{bmatrix} \begin{bmatrix} V_1 \\ V_2 \\ \vdots \\ V_n \end{bmatrix}$$

The resulting aggregate read currents $I_1$, $I_2$, . . . $I_m$ at the output of the respective RLs can be integrated by respective current integrator circuits 502 to generate respective output voltages, which can then be quantized by the respective ADC circuitry 504 to generate a resulting output vector $y=[y_1, y_2, \ldots y_m]$.

The forward pass operation shown in FIG. 5*a* for training the neural network 304 can be performed to calculate node 312 activations of a downstream layer (hidden layer or output layer) 312 based on (i) node 312 activations of an upstream layer (input layer or hidden layer) 310 and (ii) the synaptic weights that connect the nodes 312 of the upstream layer 310 to the nodes 312 of the downstream layer 310. For a single fully connected layer 310 where, for example, n input nodes 312 are connected to m output (or hidden) nodes 312, the forward pass cycle involves computing a matrix-vector multiplication y=Wx, where the input digital vector $x=[x_1, x_2, \ldots xn]$ represents the activities of the input nodes (such as upstream node 312 excitation) and the matrix $W_i$ of size {m×n} stores the synaptic weight values between each pair of input and output nodes 312. The resulting digital output vector $y=[y_1, y_2, \ldots y_m]$ is further processed by performing a non-linear activation on each of the elements and transmitting results to the next downstream layer 310 to continue the forward propagation operation.

These vector-matrix multiplications are performed as the training data propagates forward through layers 310 of the neural network 304. The hidden nodes 312 receive the inputs, perform a non-linear transformation, and then send the results to the next layer 310. This process continues until the data reaches the output layer 3107 of the neural network 304. The output nodes 3127 evaluate inferential errors and generate corresponding error signals. The error is then propagated back through the neural network 304 using backward pass operations.

Figure 5B:
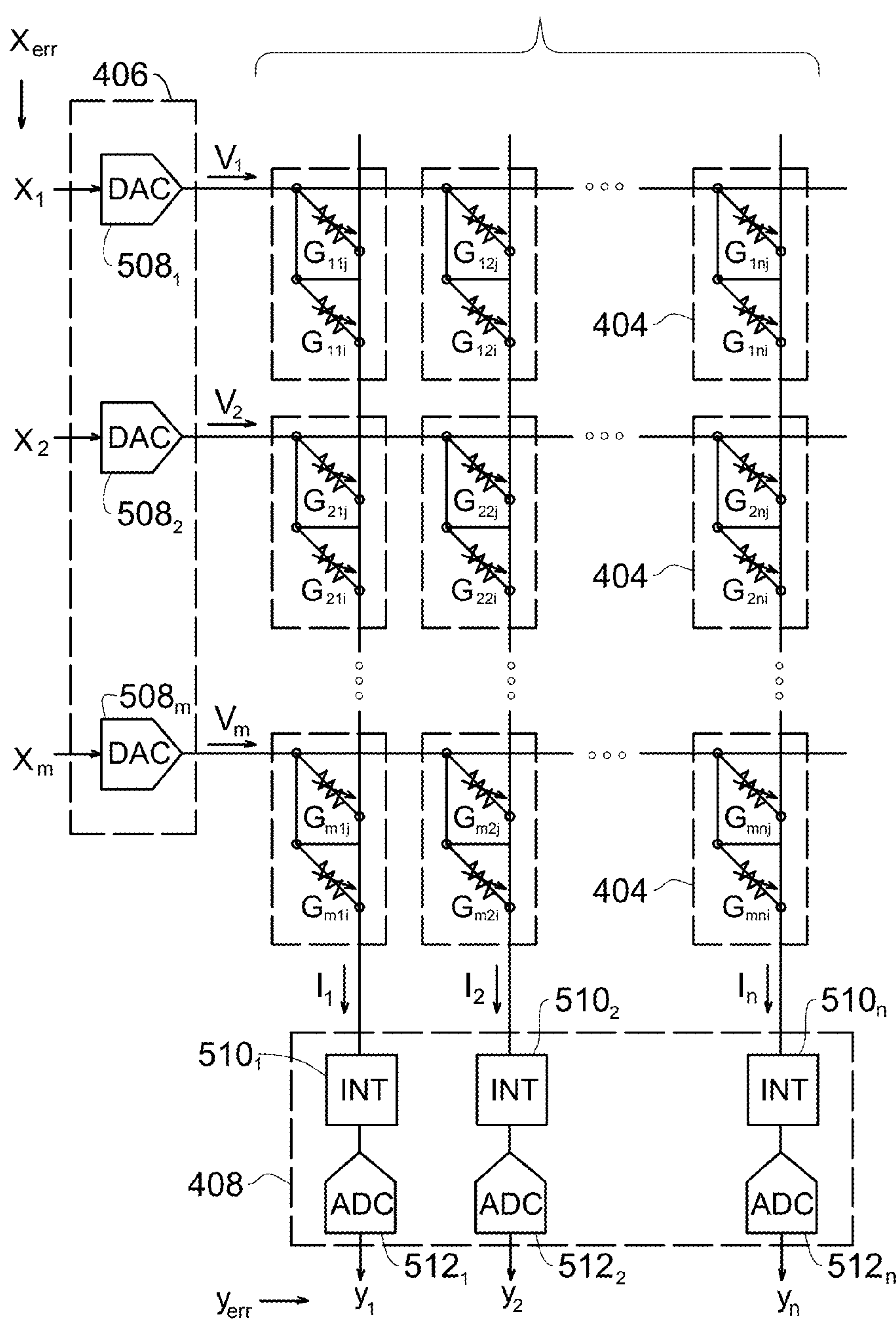
FIG. 5*b* schematically illustrates the array of non-volatile resistive memory elements in FIG. 4 during a backward training pass, consistent with illustrative embodiments.

Continuing this example, FIG. 5*b* schematically illustrates an exemplary configuration for performing a backward pass operation by performing an analog matrix-vector multiplication operation on a transpose of the synaptic weight matrix $W_i$. As in the forward pass operation above, the RPU array 402 can be configured to control switching circuitry in the row peripheral circuitry block 406 and the column peripheral circuitry block 408 to (i) selectively connect row DAC circuitry 508 to the respective RLs, and to (ii) selectively connect column readout circuitry, including current integrator circuitry 510 and ADC circuitry 512 in these illustrative embodiments, to the respective CLs.

In the exemplary configuration of FIG. 5*b*, a matrix-vector multiplication process $y_{err}=W^T x_{err}$ begins by inputting a digital vector $x_{err}=[x_1, x_2, \ldots x_m]$ to the RLs of the RPU array 402. The DAC circuitry 508 generates analog voltages $V_1, V_2, \ldots V_m$ at the input to the respective RLs that are proportional to the input vector values $x_1, x_2, \ldots x_m$, respectively. In some embodiments, the DAC circuitry 508 can be configured with pulse-width modulation circuitry and driver circuitry to generate pulse-width modulated (PWM) read pulses $V_1, V_2, \ldots V_m$ that are applied to the respective RLs. The DAC circuitry 508 can be configured to perform a digital-to-analog conversion according to a time-encoding scheme where the vector elements $x_1, x_2, \ldots x_m$ are represented by fixed amplitude pulses and a tunable duration.

To perform a matrix-vector multiplication, the analog input pulses $V_1, V_2, \ldots V_m$ can be applied to the RLs. Each RPU 316 generates a corresponding read current $I_i$. The read currents that are generated by the RPUs 316 on each CL are summed together to generate respective currents $I_1, I_2, \ldots I_n$ at the output of the respective CLs. The resulting row currents $I_1, I_2, \ldots I_n$ represent the result of performing matrix-vector multiplication operations with a transpose of the weight matrix $W_i^T$ and the input pulses $V_i$:

$$\begin{bmatrix} I_1 \\ I_2 \\ \vdots \\ I_n \end{bmatrix} = \begin{bmatrix} G_{11j} & G_{21j} & \ldots & G_{m1j} \\ G_{12j} & G_{22j} & \ldots & G_{m2j} \\ \vdots & \vdots & \ldots & \vdots \\ G_{1nj} & G_{2nj} & \ldots & G_{mnj} \end{bmatrix} \begin{bmatrix} V_1 \\ V_2 \\ \vdots \\ V_m \end{bmatrix}$$

The digital input vector $x_{err}$ represents the error calculated by the nodes 312 of a downstream layer 310, and the digital output signal $y_{err}$ represents the error signal that is generated and transmitted to the next upstream layer 310 of the neural network 304 to continue the backward propagation operation. The backward propagation process continues until the error signals reach the input layer 3101 of the neural network 304.

After the backward pass operation is completed, a weight update process can be performed to update the weight matrix $W_i$ with the newly computed conductance values of the RPUs 316 based on the forward-propagated digital vector x and the backward-propagated digital error vector $x_{err}$. To perform the weight update operation, the RPU array 402 can be configured by controlling switching circuitry in the peripheral circuitry 406, 408 to (i) selectively connect the row DAC circuitry 508 to the respective RLs, and to (ii) selectively connect the column readout circuitry 510, 512 to the respective CLs.

Recapping, FIGS. 4, 5*a* and 5*b* depict an RPU system 400 configured to perform in-memory computing operations for training a neural network 304, consistent with illustrative embodiments. The RPU system 400 can include a crossbar array of row control lines RLs and column control lines CL, and a plurality of non-volatile resistive memory elements 404. Each of the non-volatile resistive memory elements 404 can include two RPUs $\mathbf{316}_i$, $\mathbf{316}_j$.

In an example, the RPUs $\mathbf{316}_i$ in the non-volatile resistive memory elements 404 can be constructed of a first ferroelectric field effect transistor (FeFET) configured to store a conductance value in the synaptic weight matrix $W_i$. The RPUs 316*j* in the non-volatile resistive memory elements 404 can be constructed of a second FeFET configured to store a conductance value in the gradient accumulation matrix $W_j$.

Figure 6:
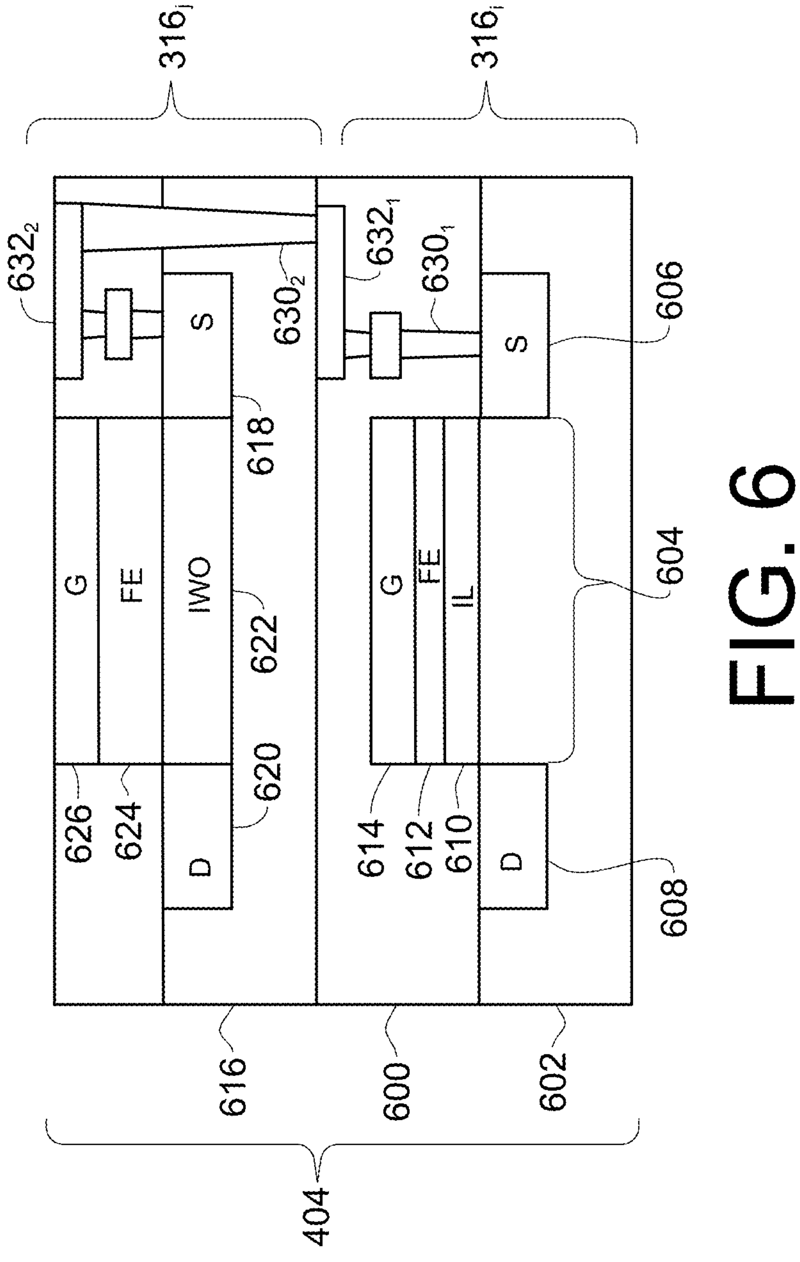
FIG. 6 depicts the non-volatile resistive memory element in FIG. 4 constructed of two ferroelectric field effect transistors (FeFETs) having a common source line, consistent with illustrative embodiments.

FIG. 6 schematically illustrates a complementary metal oxide semiconductor (CMOS) circuit vertically integrating two different FeFETs, each specially constructed to better serve the particular purposes of the synaptic gradient matrix $W_i$ and the gradient accumulation matrix $W_j$ in the RPU system 400. Generally, field effect transistor (FET) devices typically have a source, a channel, and a drain. Current flows from the source to the drain, and a gate controls the flow of current through the device channel. FeFETs can have a variety of different constructions, including those in which the source, channel, and drain are formed in the substrate material itself, and those in which the source, channel, and drain extend outwardly from the substrate material. In both cases, the current flows horizontally from the source to the drain, or within the plane of the substrate. Depending on the doping used to form the source and the drain, an NFET or a PFET can be formed.

In this detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the drawing figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip. As used herein, the term "vertical" describes an orientation that is arranged perpendicular to the first surface of a chip, chip carrier, or semiconductor body. As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments can be used, and structural or logical changes can be made without departing from the spirit and scope defined by the claims. The description of the embodiments is not limiting. In particular, elements of the embodiments described hereinafter may be combined with elements of different embodiments.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Fabrication of computing environment 100 can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, computing environment 100 can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (RIE), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

FIG. 6 depicts the first RPU 316$_i$ and the second RPU 316$_j$ formed on a support substrate 600. In some embodiments, the RPU 316$_i$ can be formed as a front end of line (FEOL) device and the RPU 316$_j$ can be formed as a back end of line (BEOL) device. The support substrate 600 can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the disclosure, the support substrate 600 can include a buried oxide layer in a silicon-on-insulator (SOI) configuration. The buried oxide layer can be made of any suitable dielectric material, such as, for example, a silicon oxide. In some embodiments of the invention, the buried oxide layer can be formed to a thickness of about 10-200 nm, although other thicknesses are within the contemplated scope of the disclosure. In some embodiments, the semiconductor structure can also be formed without the buried oxide layer. In that case, a shallow trench isolation (STI) can be formed to isolate device from device.

For the FEOL RPU 316$_i$, a first semiconductor substrate 602 can be formed on the support substrate 600. In this illustrative example, the FEOL RPU 316$_i$ is partially formed in the support substrate 600. The semiconductor substrate 602 can formed of silicon, while it will be understood that other materials can be used as well, including, without limitation, silicon dioxide, aluminum oxide, sapphire, germanium, gallium arsenide (GaAs), an alloy of silicon and germanium, or indium phosphide (InP). Accordingly, as used herein, the term substrate includes all forms of semiconductor structures. The term "semiconductor" as used herein denotes any semiconducting material including, for example, Si, Ge, SiGe, SiC, SiGeC, and III-V compound semiconductors such as InAs, GaAs and InP. Generally, the semiconductor substrate 602 can be formed of any suitable chip/wafer material (such as a silicon substrate), and be any suitable size, shape, and/or dimensions.

A dummy gate (not depicted) can be formed on a portion of the semiconductor substrate 602 that will serve as a channel region 604 for the RPU 316$_i$. Suitable dummy gate materials include, but are not limited to, poly-silicon (or poly-Si). Placement of the dummy gate permits the placement of the source region 606 and the drain region 608 of the device.

The source region 606 and drain region 608 can be formed by doped epitaxy on the semiconductor substrate 602. The process can employ n-doping to form an n-type FET, or the process can employ p-doping to form an p-type field effect transistor device. Following formation of the source and drain regions 606, 608, the dummy gate can be removed and replaced with a replacement gate stack. Thus, potential damage to the replacement gate stack (such as from processing conditions like dopant implant and/or activation anneals) can be avoided since the gate stack is not formed until after complete formations of the channel region 604, the source region 606 and the drain region 608.

A dielectric interfacial layer 610 can then be formed over the channel region 604, putting it between the first channel region 604 and a first ferroelectric layer 612. The interfacial layer 610 can be a different material than the first channel region 604. Advantageously, the interfacial layer 610 can be formed of a material providing a top surface of higher uniformity than that of the first channel region 604. The interfacial layer can, for example, be a dielectric, metal oxide, or metal that is: (1) amorphous; (2) monocrystalline; (3) crystalline with low grain size variation; (4) crystalline with a high percentage of grains sharing a common orientation; (5) crystalline with a high percentage of grains having a small grain size; or 6) any combination of the foregoing. It has been appreciated that such materials lead to high texture uniformity at the top surface of the interfacial layer. Notwithstanding the foregoing materials enumerated above for the interfacial layer, other suitable materials are amenable.

Because the interfacial layer 610 can be a dielectric, metal oxide, or metal that is amorphous or crystalline, the interfacial layer 610 can be integrated into embedded memory structures and processes without concern for the interfacial layer 610 causing deleterious contamination. Because the ferroelectric layer 612 is formed on the top surface of the first channel region 604, and because the interfacial layer's 610 top surface is highly uniform, properties of the ferroelectric layer 612 can be enhanced and/or can have high uniformity. For example, remanent polarization can have a high uniformity. As another example, remanent polarization can be enhanced, whereby read operations can be less prone to failure.

In some embodiments, the interfacial layer 610 can be formed of a thin layer of insulating material including, but not limited to, a silicon oxide material (such as silicon dioxide), a silicon nitride material (such as SiN, SiON), or other suitable types of insulating materials. The interfacial layer 610 can provide a buffer layer to enhance the quality of the interface between the surface of the first channel region 604 and the ferroelectric layer 612. This interfacial barrier can reduce an amount of charge traps and can prevent reactions between the different materials of the ferroelectric layer 612 and the first channel region 604. The interfacial layer 610 is provided in the FEOL RPU 316$_i$ generally to enhance long term storage performance of the stored conductance values that represent the synaptic weight matrix $W_i$.

The ferroelectric (FE) layer 612 can be formed on the interfacial layer 610, such as by physical vapor deposition (PVD), chemical vapor deposition (CVD), plasma enhanced CVD (PECVD), and combinations thereof. In various embodiments, the FE layer 612 can be a ferroelectric material, including, but not limited to, hafnium oxide ($HfO_2$), zirconium oxide ($ZrO_2$), hafnium zirconium oxide ($HfZrO_2$), hafnium silicon oxide ($HfSiO_x$), barium titanate (BaTiO), potassium niobate (KNbO), bismuth titanate (BiTiO), combinations thereof, and other types of high-k dielectric materials (such as hafnium oxides doped with aluminum, silicon, or yttrium) which can be formed with a crystalline microstructure that exhibits ferroelectric properties (such as orthorhombic ferroelectric phase).

A first conductive gate electrode layer 614 can be formed on the FE layer 612, where the conductive gate electrode layer 614 can be a metal such as, for example, titanium (Ti), tantalum (Ta), tungsten (W), cobalt (Co), molybdenum (Mo), titanium aluminum (TiAl), a metal compound, for example, titanium nitride (TiN), titanium carbide (TiC), tantalum nitride (TaN), tantalum carbide (TaC), tungsten nitride (WN), titanium aluminum nitride (TiAlN), and combinations thereof. In various embodiments, the conductive gate electrode layer 614 can be formed by metal-organic chemical vapor deposition (MOCVD), atomic layer deposition (ALD), plasma enhanced ALD (PEALD), low pressure CVD (LPCVD), and combinations thereof. The conductive gate electrode layer 614 can have multiple conductive layers of different metals and/or metal compounds.

The BEOL RPU 316$_j$ similarly has a second semiconductor substrate 616 formed on the support substrate 600, a doped second source region 618, and a doped second drain region 620. But unlike the FEOL RPU 316$_i$, the BEOL RPU **316*j* has a metal oxide layer forming the second channel region 622 between the second source region 618 and the second drain region 620. The second channel region 622 can be deposited on the semiconductor substrate 616 such as by physical vapor deposition (PVD), chemical vapor deposition (CVD), plasma enhanced CVD (PECVD), and combinations thereof. In some embodiments, the second channel region 622** can be formed of indium tungsten oxide (IWO), such as with 1% by weight W doped in $In_2O_3$. Such embodiments are merely illustrative and not limiting of the contemplated embodiments of the disclosure.

A second FE layer 624 can be formed on the second channel region 622, such as by physical vapor deposition (PVD), chemical vapor deposition (CVD), plasma enhanced CVD (PECVD), and combinations thereof. In various embodiments, the second FE layer 624 can be a ferroelectric material, including, but not limited to, hafnium oxide ($HfO_2$), zirconium oxide ($ZrO_2$), hafnium zirconium oxide ($HfZrO_2$), hafnium silicon oxide ($HfSiO_x$), barium titanate (BaTiO), potassium niobate (KNbO), bismuth titanate (BiTiO), combinations thereof, and other types of high-k dielectric materials (such as hafnium oxides doped with aluminum, silicon, or yttrium) which can be formed with a crystalline microstructure that exhibits ferroelectric properties (such as orthorhombic ferroelectric phase).

A second conductive gate electrode layer 626 can be formed on the second FE layer 624, and can be a metal such as, for example, titanium (Ti), tantalum (Ta), tungsten (W), cobalt (Co), molybdenum (Mo), titanium aluminum (TiAl), a metal compound, for example, titanium nitride (TiN), titanium carbide (TiC), tantalum nitride (TaN), tantalum carbide (TaC), tungsten nitride (WN), titanium aluminum nitride (TiAlN), and combinations thereof. In various embodiments, the second conductive gate electrode layer 626 can be formed by metal-organic chemical vapor deposition (MOCVD), atomic layer deposition (ALD), plasma enhanced ALD (PEALD), low pressure CVD (LPCVD), and combinations thereof. The second conductive gate electrode layer 626 can have multiple conductive layers of different metals and/or metal compounds.

Unlike the FEOL RPU 316$_i$, the BEOL RPU 316$_j$ does not have an interfacial layer between the second channel region 622 and the second FE layer 624. Generally, ferroelectric layers such as hafnium zirconium oxide have large coercive field properties, such as on the order of $E_c$~1 MV/cm. Thus, large programming voltages are required to switch an FeFET. This further induces very high electric fields in an interfacial layer placed between an FE layer and a channel region. Such high electric fields force electrons into the interfacial layer tunneling regime, leading to the injection of hot electrons. This process can cause severe charge trapping and generation of traps, which can lead to endurance failure.

The BEOL RPUs 316$_j$ are allocated to the gradient accumulation matrix $W_j$, which is used to perform matrix-vector and matrix-matrix operations during forward and backward training passes on the neural network 304. Because the gradients computed from forward training passes can advantageously be accumulated and summed (instead of individually processed) to update the weights for the machine learning model, the BEOL RPUs 316$_j$ can be subjected to significantly more write processes than the FEOL RPUs 316$_i$ used to store the synaptic weight values. Thus, not including an interfacial layer between the second FE layer 624 and the second channel region 622 provides BEOL RPUs 316$_j$ with comparatively greater endurance for the high-write conditions of the gradient accumulation matrix $W_j$. Using a metal oxide such as IWO for the second channel region 622 inhibits formation of an interfacial layer on the semiconductor substrate 616 and enables stable threshold voltage.

In the embodiments of FIG. 6, inter-tier circuitries can include vias 630 and traces 632 that form an illustrative connecting circuit that electrically connects the first source region 606 to the second source region 618.

Figure 7:
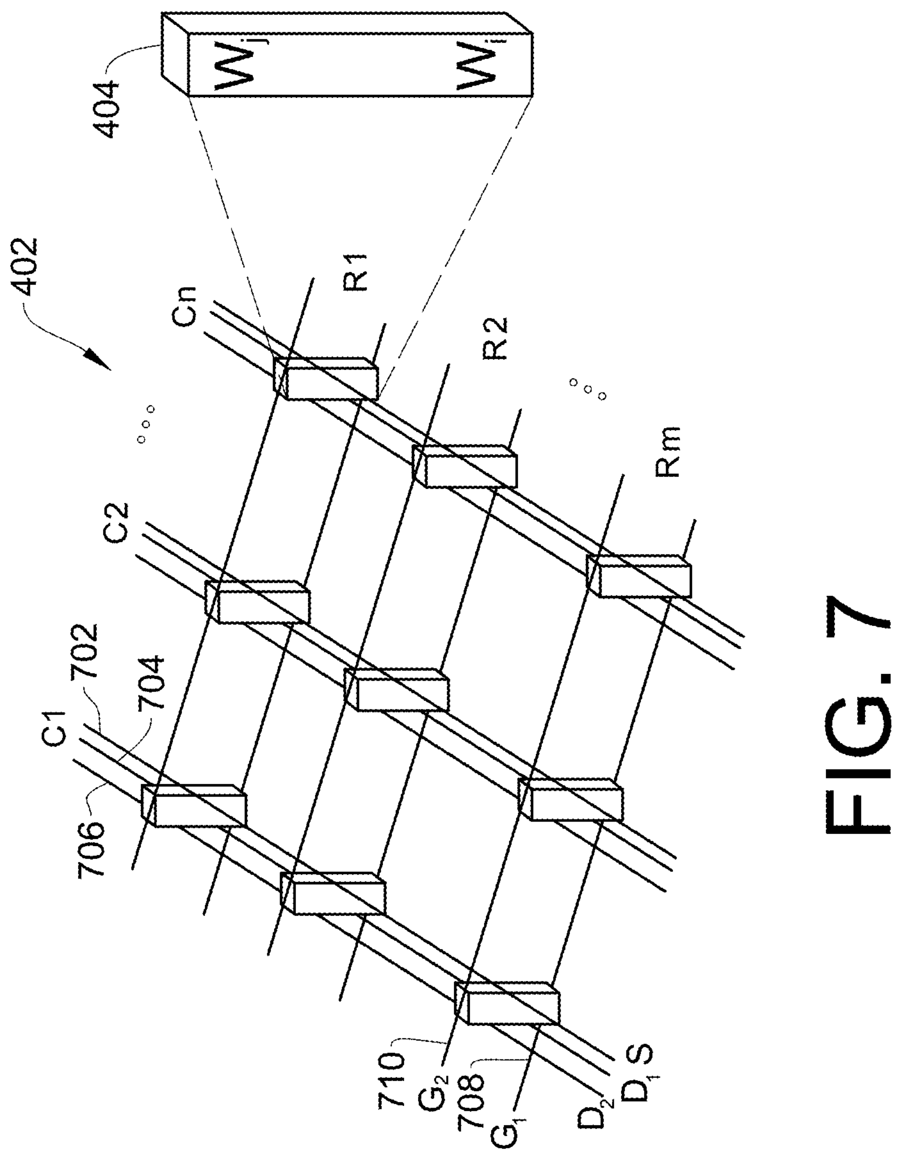
FIG. 7 depicts an array of the non-volatile resistive memory elements in FIG. 6, consistent with illustrative embodiments.

FIG. 7 illustrates the RPU array 402 (FIG. 4) with a plurality of non-volatile resistive memory elements 404 configured as in FIG. 6. That is, each non-volatile memory element 404 includes an FEOL RPU 316$_i$ configured for storing conductance values in the synaptic weight matrix $W_i$ and a BEOL RPU 316$_j$ configured for storing conductance values in the gradient accumulation matrix $W_j$. Also, the first and second source regions 606, 618 (FIG. 6) are connected together, such as by the interconnecting vias 630 and traces 632 depicted in FIG. 6.

In the configuration of FIGS. 6 and 7, each of the column lines CLs includes a source line 702 that is commonly connected to the source regions 606, 618 of both FeFETs. The CLs can also include a first drain line 704 connected to the first drain region 608 of the FEOL FeFET, and a second drain line 706 connected to the second drain region 620 of the BEOL FeFET in each of the non-volatile resistive memory elements 404. Further, each of the row lines RLs includes a first gate line 708 connected to the first gate electrode layer 614 of the FEOL FeFET, and a second gate line 710 connected to the second gate electrode layer 626 of the BEOL FeFET in each of the non-volatile resistive memory elements 404.

In this arrangement, the two drain lines 704, 706 permit individually reading or writing each of the RPUs 316$_i$, 316$_j$ in the same non-volatile resistive memory element 404. For example, to read a conductance value from the FEOL RPU 316$_i$ in the non-volatile resistive memory element 404 in FIG. 6, a low bias voltage can be applied via the first gate line 708 to the first gate electrode layer 614. The first drain region 608 to first source region 606 voltage can be held at a low bias voltage to facilitate reading a current via the first drain line 704. To write a conductance value to the FEOL RPU 316$_i$, a high coercive voltage can be applied via the first gate line 708 to the first gate electrode layer 614, with both the common source line 702 and the first drain line 704 electrically grounded.

Similarly, to read a conductance value from the BEOL RPU 316$_j$ in the non-volatile resistive memory element 404 in FIG. 6, a low bias voltage can be applied via the second gate line 710 to the second gate electrode layer 626. The second drain region 620 to second source region 618 voltage can be held at a low bias voltage to facilitate reading a current via the second drain line 706. To write a conductance value to the BEOL RPU 316$_j$, a high coercive voltage can be applied via the second gate line 710 to the second gate electrode layer 626, with both the common source line 702 and the second drain line 706 electrically grounded.

Figure 8:
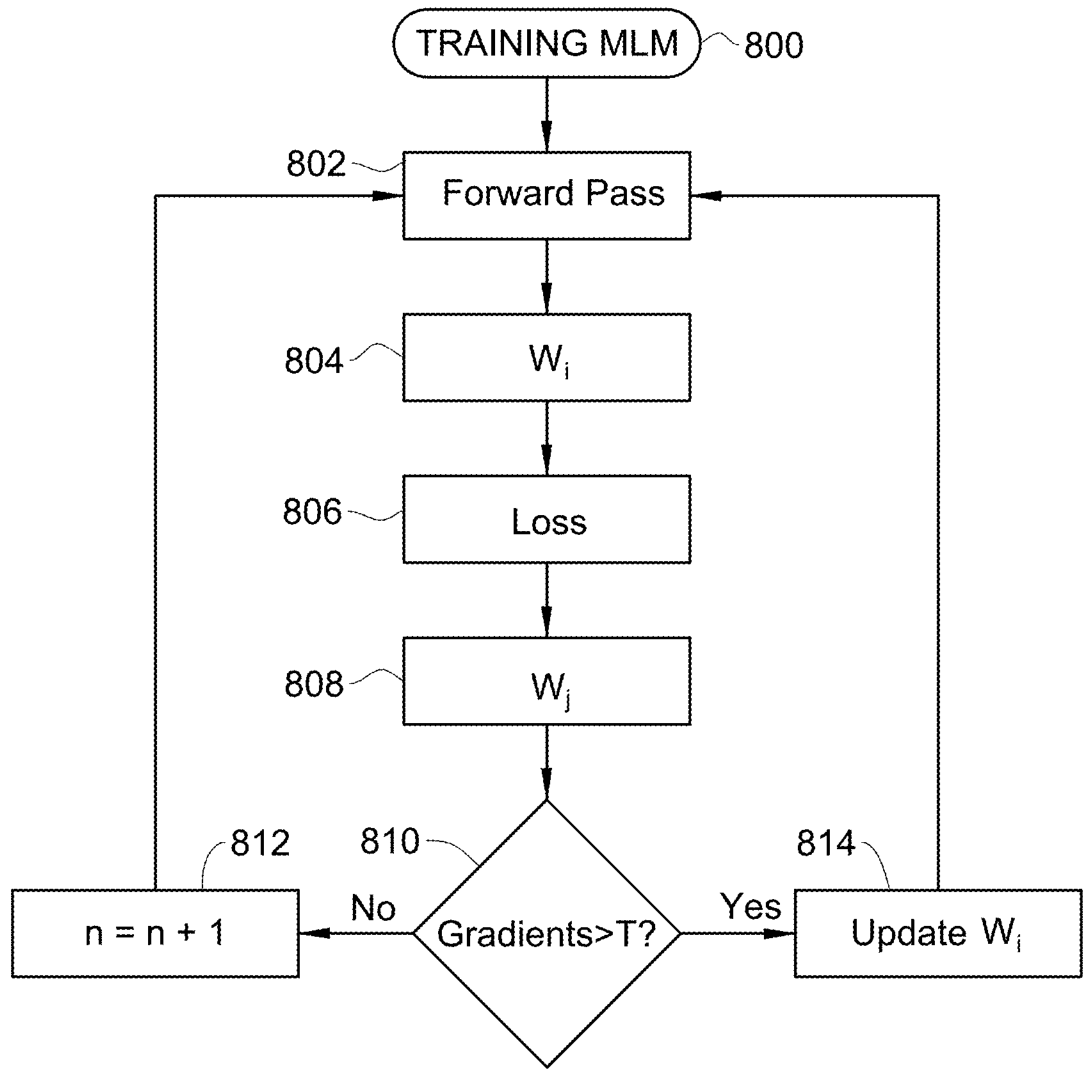
FIG. 8 is a flowchart depicting blocks in a method for training a machine learning model, consistent with illustrative embodiments.

FIG. 8 is a flowchart depicting a method 800 for training a machine learning model, such as the ML model 304, consistent with illustrative embodiments. In an embodiment, a computer program product can be provided for performing the method 800 by employing in-memory computing operations. Such a computer program product can include one or more computer readable storage media and program instructions stored on the computer readable storage media. Execution of the program instructions by a processor can cause the processor to perform steps of the method 800, such as by block 802 controlling operations during a forward pass on the ML model. At the end of a forward pass, block 804 can obtain synaptic weight values stored in the FEOL RPUs 316$_i$ making up the synaptic weight matrix $W_i$. The distinguishing interfacial layer 610 construction of the FEOL RPUs 316$_i$ make them specially configured for robust, durable long term storage and infrequent writes. The FEOL RPUs 316$_i$ are thus optimized for storing first conductance values representing synaptic weight values for the ML model 304. To obtain a stored weight value from an FEOL RPU 316$_i$, block 804 can apply a programmed bias input voltage to a gate of the FEOL RPU 316$_i$ in order to read from the FEOL RPU 316$_i$ a product of the bias input voltage and the first conductance value.

Block 806 can perform a backward pass on the machine learning model, using the weight value obtained from the FEOL RPU 316$_i$ to compute a loss value for the first forward pass read. From the computed loss value, block 806 can then compute a gradient value to minimize the loss value. Block 808 can accumulate gradient values in the BEOL RPUs 316$_j$ making up the gradient accumulation matrix $W_j$. The BEOL RPUs 316$_j$ lack an interfacial layer, such as the interfacial layer 610, making them specially configured for frequent writes and infrequent reads. The BEOL RPUs 316$_j$ are thus optimized for storing second conductance values representing gradient accumulation values for the ML model 304. For example, to store a gradient accumulation value to a BEOL RPU 316$_j$, block 808 can electrically ground the first drain region and the first source region, and apply a programmed coercive input voltage to a gate of the BEOL RPU 316$_j$ in order to write to the BEOL RPU 316$_j$ a second conductance value related to the gradient value and representing a gradient accumulation value.

Block 810 can determine whether a gradient accumulation value is greater than a predetermined threshold value. If the determination of block 810 is no, then counter 812 can be incremented and control can return to block 802 for a subsequent forward pass read on the ML model 304 with subsequent sample data in a training dataset. For example, block 802 can apply a bias drain to source voltage to the FEOL RPU 316$_i$, and can apply the bias input voltage to the gate of the FEOL RPU 316$_i$ to read from the FEOL RPU 316$_i$ the product of the bias input voltage and the first conductance value representing the synaptic weight value.

If the determination of block 810 is yes, then the subsequent forward pass read on the ML model 304 can be with subsequent sample data and updated synaptic weight values. Block 814 can compute updated synaptic weight values that are related to the gradient accumulation values. For example, block 814 can electrically ground the first drain region and the first source region, and can apply a coercive input voltage to the gate of the FEOL RPU 316$_i$ to write to the FEOL RPU 316$_i$ third conductance values representing the updated synaptic weight values. The subsequent forward pass read on the ML model 304 can be performed by block 814 applying a bias drain to source voltage to the FEOL RPU 316$_i$ and applying the bias input voltage to the gate of the FEOL RPU 316$_i$ to read from the FEOL RPU 316$_i$ the product of the bias input voltage and the third conductance value representing the updated synaptic value.

Figure 9:
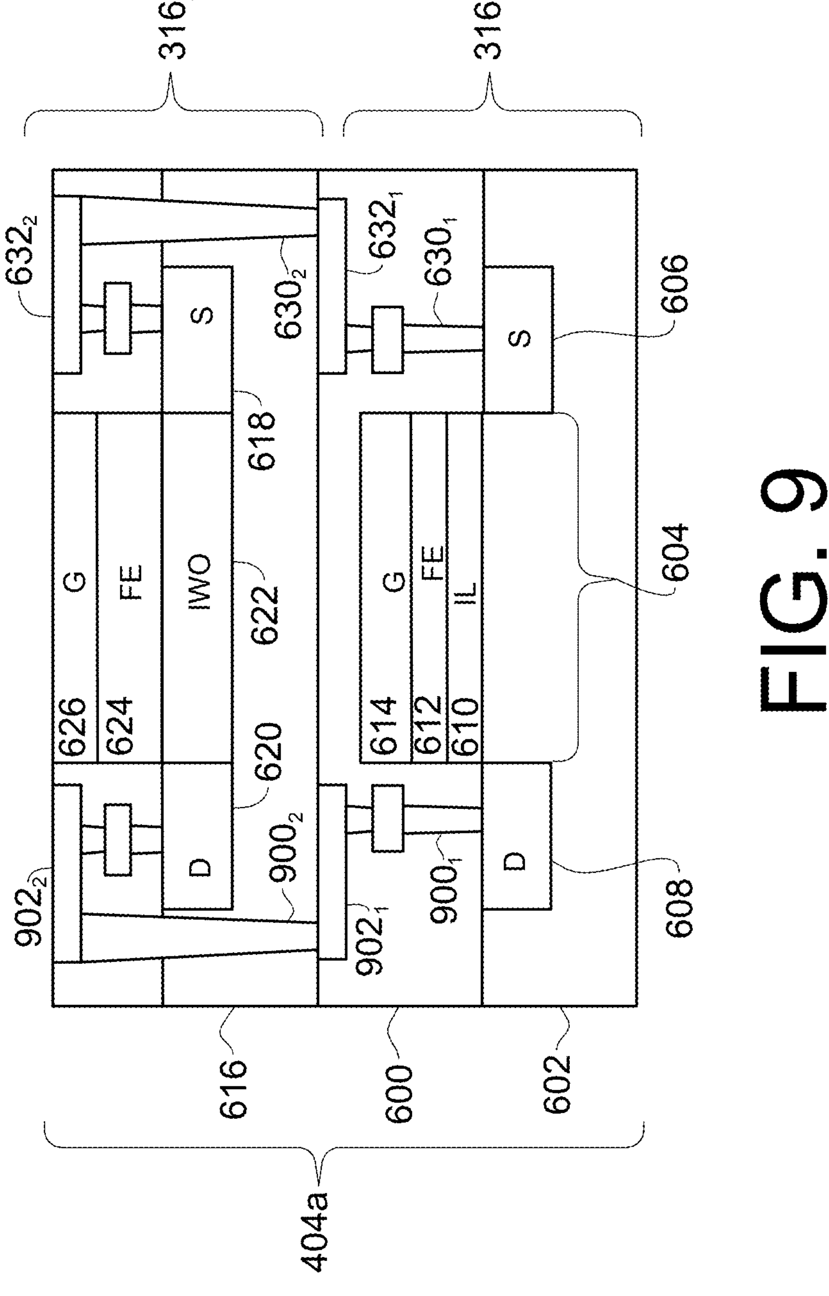
FIG. 9 depicts the non-volatile resistive memory element in FIG. 4 constructed of two FeFETs having a common source line and a common drain line, consistent with illustrative embodiments.

FIG. 9 depicts another non-volatile resistive memory element 404*a* constructed of two FeFETs having a common source line and a common drain line. In addition to the vias 630 and traces 632 electrically connecting the first source region 606 to the second source region 618, more vias 900 and traces 902 can connect the first drain region 608 to the second drain region 620. The non-volatile resistive memory element 404*a* in FIG. 9 functions similarly as the non-volatile resistive memory element 400 in FIG. 6, but operates in different ways that can be advantageous for signal processing.

So, in the embodiments of FIG. 9, a first connecting circuit electrically connects the first source region to the second source region and a second connecting circuit electrically connects the first drain region to the second drain region. In those embodiments, to read the FEOL RPU $\mathbf{316}_i$ the first programmed bias input voltage can be applied to the gate of the FEOL RPU $\mathbf{316}_i$ to read it, and a different second programmed bias input voltage can be applied to the gate of the BEOL RPU $\mathbf{316}_j$ to turn it off. For example, in some embodiments the first programmed bias input voltage can be a high bias input voltage (such as +0.2V) to turn the FEOL RPU $\mathbf{316}_i$ on and the second programmed bias input voltage can be a low bias input voltage (such as +0.1V) to turn the BEOL RPU $\mathbf{316}_j$ off. In other embodiments, the first programmed bias input voltage can be a positive bias input voltage (such as +0.2V) to turn the FEOL RPU $\mathbf{316}_i$ on and the second programmed bias input voltage can be a negative bias input voltage (such as −0.1V) to turn the BEOL RPU $\mathbf{316}_j$ off.

Figure 10:
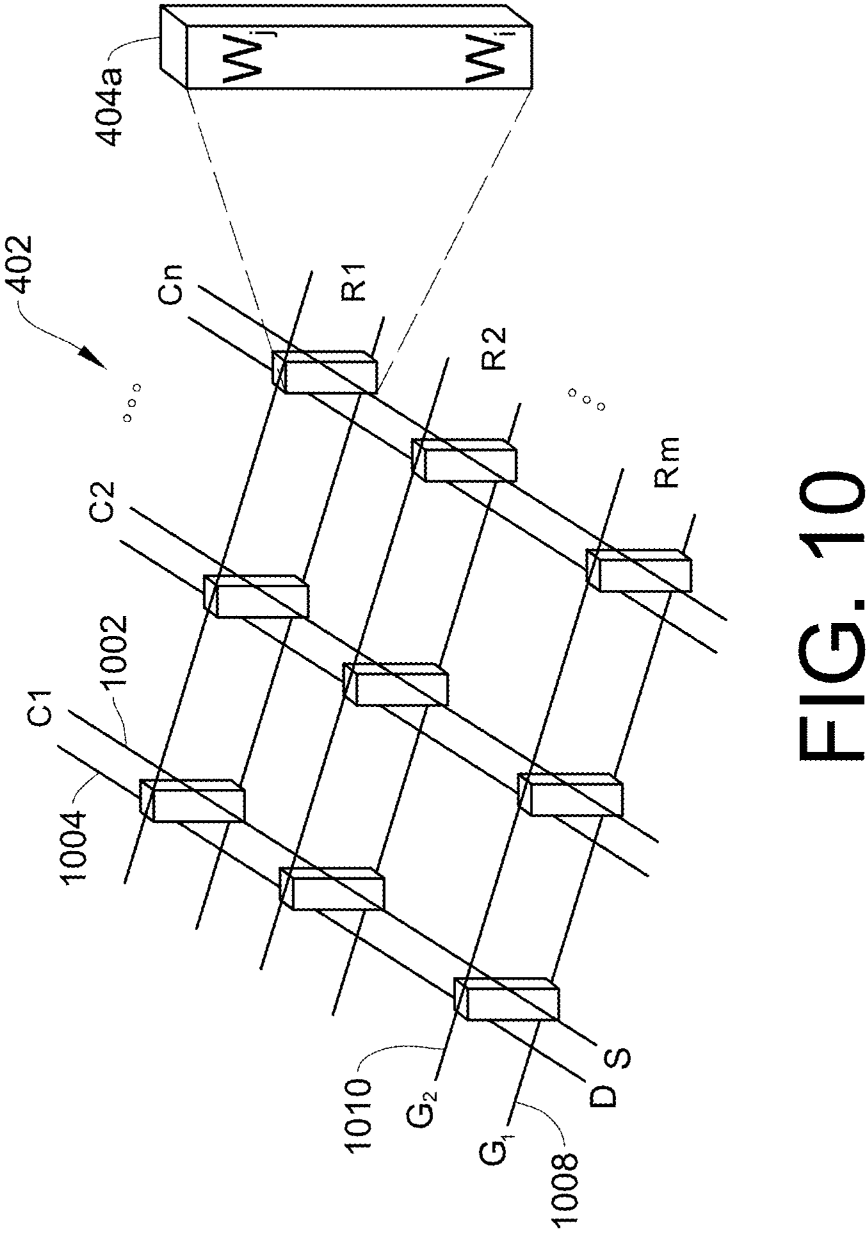
FIG. 10 depicts an array of the non-volatile resistive memory elements in FIG. 9, consistent with illustrative embodiments.

FIG. 10 illustrates the RPU array 402 (FIG. 4) with a plurality of non-volatile resistive memory elements 404*a* configured as in FIG. 9. Each of the column lines CLs can include a source line 1002 that is commonly connected to the first and second source regions 606, 618 in the FeFETs. The CLs can also include a drain line 1004 that is commonly connected to the first and second drain regions 608, 620 in the FeFETs. Each of the row lines RLs can include a first gate line 1008 connected to the first gate electrode layer 614 of the FEOL FeFET, and a second gate line 1010 connected to the second gate electrode layer 626 of the BEOL FeFET in each of the non-volatile resistive memory elements 404*a*.

In this arrangement, the common drain line 1004 enables reading the sum of RPUs $\mathbf{316}_i$, $\mathbf{316}_j$ in the same non-volatile resistive memory element 404*a* with predefined weight on each. On the other hand, one of the RPUs $\mathbf{316}_i$, $\mathbf{316}_j$ is turned off during writes to independently program RPUs $\mathbf{316}_i$, $\mathbf{316}_j$.

Figure 11:
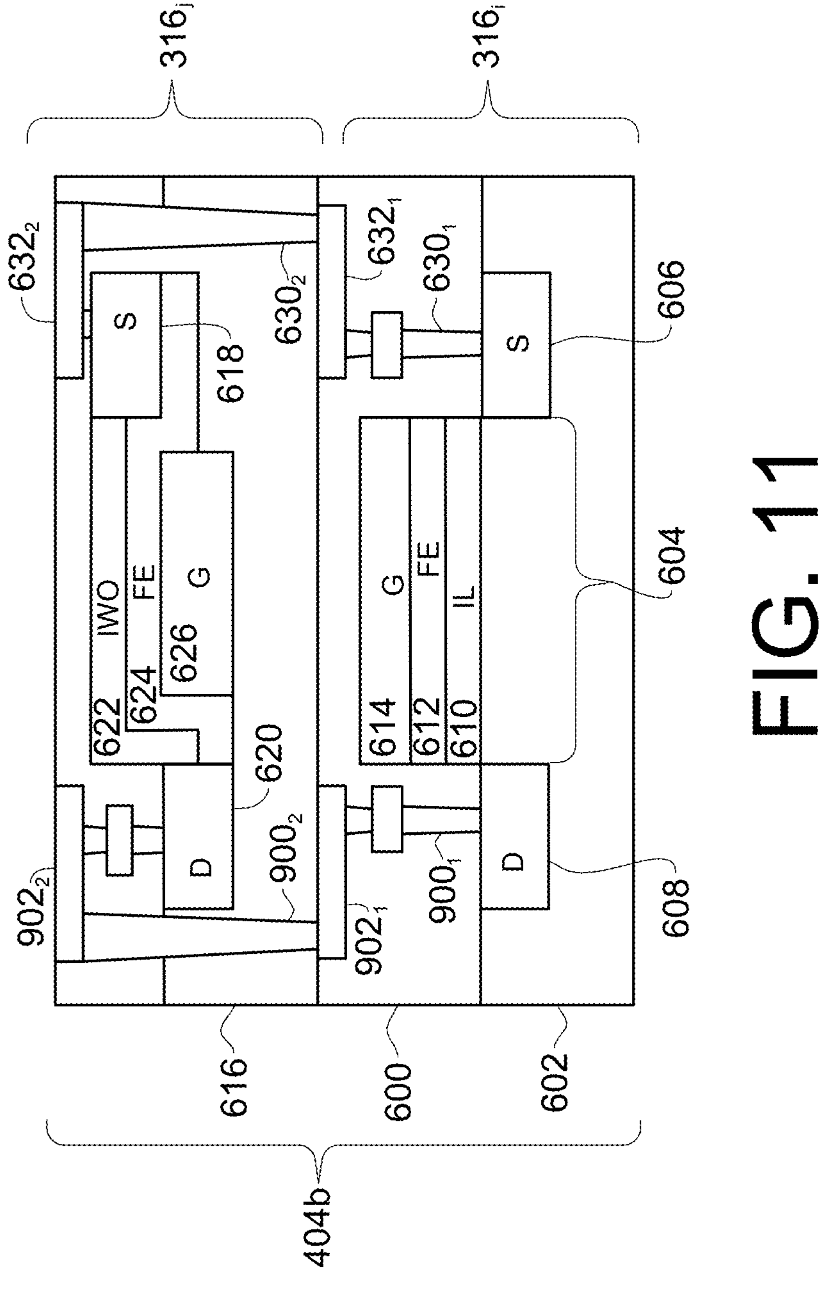
FIG. 11 depicts the non-volatile resistive memory element in FIG. 4 constructed of two FeFETs having gates all around, consistent with illustrative embodiments.

For example, in some embodiments, to read a conductance value from the RPU $\mathbf{316}_i$ in the non-volatile resistive memory element 404*a* in FIG. 9, the gate voltage for the RPU 316*i* ($V_{gi}$) can be adjusted to achieve a low target value such as γ=0.01. Reduction of the read voltage such as with a subthreshold swing of 100 mV/dec to turn the RPU 316*j* off can be achieved by lowering the $V_{gj}$ by about 200 mV compared to the typical read bias. For example, a high bias $V_{gi}$ such as about 0.2 V can be applied to the first gate electrode layer 614 and a low bias $V_{gj}$ such as about 0 V can be applied to the second gate electrode layer 626 to read $\gamma W_j+W_i$ where γ=0.01. The drain to source voltage can be kept a small bias such as about 0.1 V to facilitate the read operation. FIG. 11 depicts yet another non-volatile resistive memory element 404*b* constructed of two FeFETs, where at least one of the FeFETs can be vertically integrated to form a gate all around (GAA) FET. Also having a common source line and a common drain line, the non-volatile resistive memory element 404*b* in FIG. 11 operates similarly to the non-volatile resistive memory element 404*a* in FIG. 9.

Figure 12:
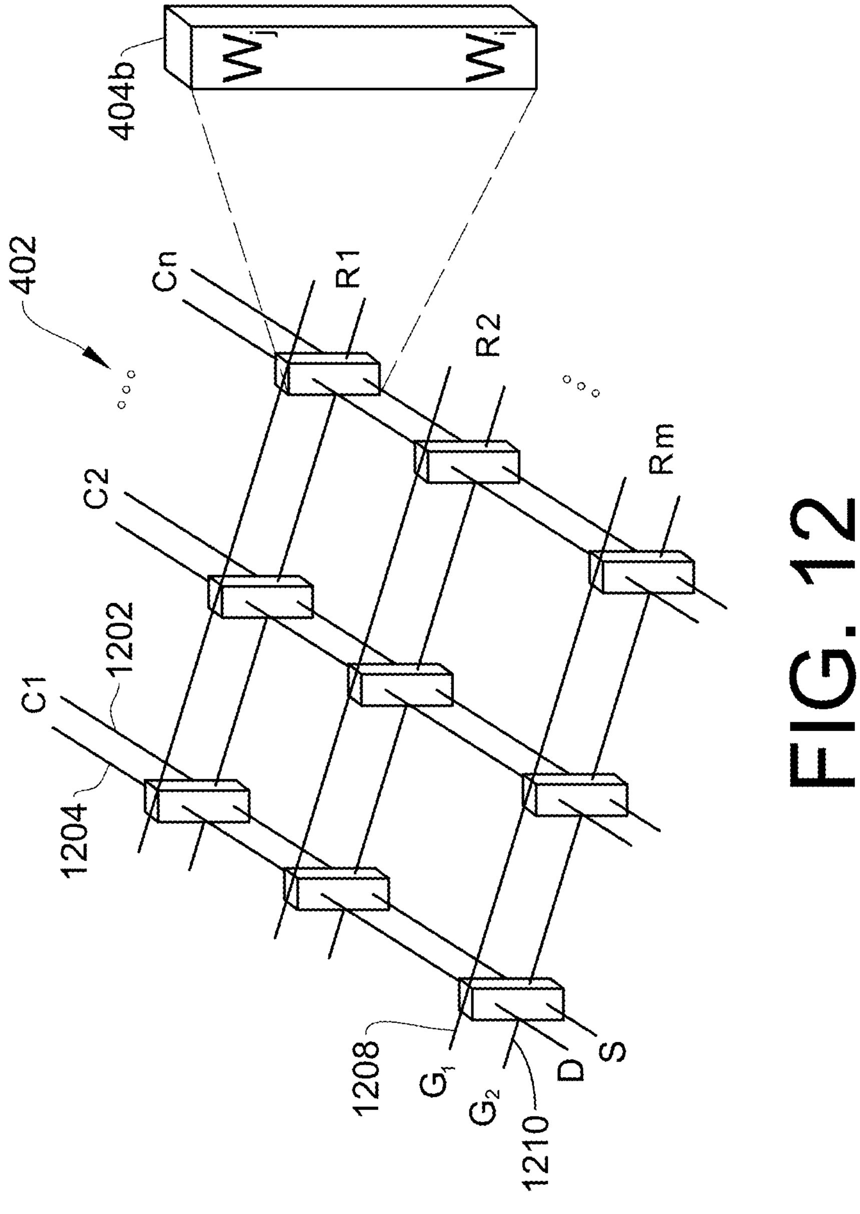
FIG. 12 depicts an array of the non-volatile resistive memory elements in FIG. 11, consistent with illustrative embodiments.

FIG. 12 illustrates the RPU array 402 (FIG. 4) with a plurality of non-volatile resistive memory elements 404*b* configured as in FIG. 11. Each of the column lines CLs can include a source line 1202 that is commonly connected to both source regions 606, 618 in the FeFETs. The CLs can also include a drain line 1204 that is commonly connected to both drain regions 608, 620 in the FeFETs. Each of the row lines RLs can include a first gate line 1208 connected to the first gate electrode layer 614 of the FEOL FeFET, and a second gate line 1210 connected to the second gate electrode layer 626 of the BEOL FeFET in each of the non-volatile resistive memory elements 404*b*. As in the FeFET of FIG. 9, to read the RPUs $\mathbf{316}_i$ a high bias Vgi such as about 0.2 V can be applied to the first gate electrode layer 614 and a low bias Vgj such as about 0 V can be applied to the second gate electrode layer 626 to read $\gamma W_j+W_i$ for a low gamma value, such as where γ=0.01.

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Numerous other embodiments are also contemplated. These include embodiments that have fewer, additional, and/or different components, steps, features, objects, benefits, and advantages. These also include embodiments in which the components and/or steps are arranged and/or ordered differently.

Aspects of the present disclosure are described herein with reference to illustrations and/or block diagrams of a method, apparatus (systems), and computer program products according to embodiments of the present disclosure. It will be understood that each step of the flowchart illustrations and/or block diagrams, and combinations of blocks in the call flow illustrations and/or block diagrams, can be implemented by computer readable program instructions.

These computer readable program instructions may be provided to a processor of a computer, special purpose computer, or other programmable data processing apparatus to produce a machine, such that the instructions, which execute via the processor of the computer or other programmable data processing apparatus, create means for implementing the functions/acts specified in the call flow process and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the call flow and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the call flow process and/or block diagram block or blocks.

The flowchart and block diagrams in the Figures illustrate the architecture, functionality, and operation of possible implementations of systems, methods, and computer program products according to various embodiments of the present disclosure. In this regard, each block in the call flow process or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or call flow illustration, and combinations of blocks in the block diagrams and/or call flow illustration, can be implemented by special purpose hardware-based systems that perform the specified functions or acts or carry out combinations of special purpose hardware and computer instructions.

It is to be appreciated that the computer system (e.g., the specialized computer 101, the IMC engine 180, and/or the processing resources) performs acts involving signal processing that cannot be performed by a human (e.g., is greater than the capability of a single human mind). For example, an amount of data processed, a speed of processing of data and/or data types of the data processed over a certain period of time can be greater, faster and different than an amount, speed and data type that can be processed by a single human mind over the same period of time. The computer system can also be fully operational towards performing one or more other functions while also performing the above-referenced signal processing functions. Moreover, signal processing output generated by the computer system can include information that is impossible to obtain manually by a user. For example, an amount of information included in the signal processing output and/or a variety of information included in the signal processing output can be more complex than information obtained manually by a user.

Moreover, because at least the signal processing is established from a combination of electrical and mechanical components and circuitry, a human is unable to replicate or perform processing performed by the computer system (e.g., specialized computer 101, the ICM engine 180, resources) disclosed herein. For example, a human is unable to communicate data and/or process data associated with the ICM engine 180 for a given downstream task. Additionally, the specialized computer 101 significantly improves the operating efficiencies of the computer system by accurately and reliably eliminating detrimental signal amplitude instability and noise.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed:

1. A resistive processing unit (RPU) system configured to perform in-memory computing operations for training a machine learning model, the RPU system comprising:

a crossbar array of row control lines intersecting column control lines; and a plurality of non-volatile resistive memory elements, each connected to one of the row control lines and to one of the column control lines, each non-volatile resistive memory element comprising:

a first ferroelectric field-effect-transistor (FeFET) configured to store a first conductance value that represents a synaptic weight value for the machine learning model; and a second FeFET configured to store a second conductance value that represents a gradient accumulation value for the machine learning model.

2. The RPU system of claim 1, wherein:

the first FeFET comprises:

a first semiconductor substrate, comprising:

a first source region;

a first drain region; and a first channel region between the first source and first drain regions;

a first ferroelectric layer; and an interfacial layer between the first channel region and the first ferroelectric layer; and the second FeFET comprises:

a second semiconductor substrate, comprising:

a second source region;

a second drain region; and a second channel region between the second source and second drain regions; and a second ferroelectric layer, wherein there is no interfacial layer between the second channel region and the second ferroelectric layer.

3. The RPU system of claim 2, wherein the first FeFET and the second FeFET are vertically integrated on the first semiconductor substrate and the second semiconductor substrate.

4. The RPU system of claim 2, further comprising a first connecting circuit electrically connecting the first source region to the second source region.

5. The RPU system of claim 4, further comprising:

a first gate electrode layer on the first ferroelectric layer;

a second gate electrode layer on the second ferroelectric layer, wherein:

at least one of the first source region and the second source region is configured to be connected to a source line;

the first gate electrode layer is configured to be connected to a first gate line;

the second gate electrode layer is configured to be connected to a second gate line;

the first drain region is configured to be connected to a first drain line; and the second drain region is configured to be connected to a second drain line.

6. The RPU system of claim 2, further comprising a second connecting circuit electrically connecting the first drain region to the second drain region.

7. The RPU system of claim 6, further comprising:

a first gate electrode layer on the first ferroelectric layer; and a second gate electrode layer on the second ferroelectric layer, wherein:

at least one of the first source region and the second source region is configured to be connected to a source line;

the first gate electrode layer is configured to be connected to a first gate line;

the second gate electrode layer is configured to be connected to a second gate line; and at least one of the first drain region and the second drain region is configured to be connected to a drain line.

* * * * *